(12) United States Patent
Kapetanic et al.

(10) Patent No.: US 6,396,287 B1
(45) Date of Patent: *May 28, 2002

(54) PROCESS FOR MEASURING OUTPUT HARMONIC RELATIVE TO OUTPUT FUNDAMENTAL WITH ENHANCED ACCURACY

(75) Inventors: Peter Kapetanic, Morgan Hill; Jon Martens; David Rangel, both of San Jose, all of CA (US)

(73) Assignee: Anritsu Company, Morgan Hill, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/388,405

(22) Filed: Sep. 1, 1999

Related U.S. Application Data

(60) Provisional application No. 60/098,864, filed on Sep. 2, 1998.

(51) Int. Cl.$^7$ ................................................ G01R 27/28

(52) U.S. Cl. ........................................ 324/623; 324/650

(58) Field of Search ................................ 324/623, 620, 324/615, 612, 76.24, 601, 650, 76.19

(56) References Cited

U.S. PATENT DOCUMENTS

| | | | | |
|---|---|---|---|---|
| 3,016,475 A | * | 1/1962 | Kirsten | ...................... 324/76.77 |
| 5,089,782 A | * | 2/1992 | Pike et al. | ................... 324/623 |
| 5,307,284 A | * | 4/1994 | Brunfeldt et al. | ............ 364/685 |
| 5,343,404 A | * | 8/1994 | Girgis | ........................ 364/484 |
| 5,631,553 A | * | 5/1997 | Bose et al. | ............... 324/76.24 |
| 5,937,006 A | * | 8/1999 | Clark et al. | .................. 375/224 |

\* cited by examiner

*Primary Examiner*—Safet Metjahic
*Assistant Examiner*—Vincent Q. Nguyen
(74) *Attorney, Agent, or Firm*—Fliesler Dubb Meyer & Lovejoy LLP

(57) ABSTRACT

A method is provided for eliminating the source harmonic component from VNA measurements of the output of a device under test (DUT). A standard vector measurement, GHx, is first measured from the DUT using the VNA. The value GHx is composed of two elements, the DUT's harmonic response to a fundamental input from the source, and the DUT's linear response to the harmonic input from the source. The harmonics from the source which are linearly passed by the DUT, GNx, are then measured with the VNA. The output harmonic generated by the DUT, Hx, is then calculated using vector subtraction according to the equation Hx=GHx−GNx. The output harmonic Hx will then be free from source harmonic components.

11 Claims, 1 Drawing Sheet

PROCESS FOR MEASURING OUTPUT HARMONIC RELATIVE TO OUTPUT FUNDAMENTAL WITH ENHANCED ACCURACY

CROSS-REFERENCE TO PROVISIONAL APPLICATION

This Patent Application claims the benefit of Provisional Application No. 60/098,864, filed Sep. 2, 1998 has been expired.

BACKGROUND OF THE INVENTION

1. Field of the Invention

The present invention relates to a method for determining a harmonic response of a device, and more 5 particularly, to a method for determining a more accurate harmonic response of a device over a dynamic range not limited by the stimulus source harmonic level.

2. Background

Harmonic measurements are of significant importance in many microwave, millimeter wave, and radio frequency (RF) applications including wireless communications. Excessive harmonic generation by components such as amplifiers or other nonlinear components in a communications device can lead to violations of spectrum rules set by the Federal Communications Commission (FCC), failed performance specifications, interference with other channels, or other problems. Harmonic measurements have been made by using a conventional spectrum analyzer, but this approach can be quite slow and the results are of only limited accuracy. Therefore, conventional methods of harmonic measurements using spectrum analyzers may be undesirable in a high throughput manufacturing environment in which both speed and accuracy of harmonic measurements are required.

To satisfy the requirements of speed and accuracy in harmonic measurements in a high throughput manufacturing environment, measurement techniques have been developed by using conventional vector network analyzers. However, a problem associated with conventional non-ratioed techniques for measuring the harmonic responses of a device by using typical vector network analyzers is that the internal signal sources of typical vector network analyzers are usually not very "clean." The internal signal source of a typical vector network analyzer may generate a source harmonic in the range of −30 dB to −40 dB relative to the source fundamental frequency signal component. Although a source harmonic in the range of −30 dB to −40 dB relative to the source fundamental frequency component may not be regarded as a high harmonic level per se, the presence of such source harmonic can seriously affect the ability to accurately measure the harmonic response of a device. The presence of stimulus source harmonics can seriously limit the dynamic range of the measurements and the accuracy of the measurement results.

Therefore, there is a need for a method for measuring the harmonic response of a device with enhanced accuracy by using a typical vector network analyzer which may contain a source that has harmonics in addition to the source fundamental frequency component during the measurement of the device. Furthermore, there is a need for a method for measuring the harmonic response of a device to a fundamental frequency input with enhanced dynamic range that is not limited in measurement accuracy or dynamic range by the stimulus source harmonics.

SUMMARY OF THE INVENTION

In accordance with the present invention, a method is provided for determining the harmonic output of a DUT relative to the fundamental frequency output of the DUT. The method allows VNA calibration calculations to be made to eliminate source harmonics from DUT harmonic output measurements or at least to mitigate the effect of the source harmonics on the DUT harmonic output measurements.

Vector quantities used to determine the harmonic response of a DUT relative to an input fundamental frequency component are illustrated in FIG. 1. An output from the DUT is composed of two elements, the DUT's harmonic response to a fundamental input from the source, and the DUT's linear response to the harmonic input from the source. The vector sum of the DUT output responses, GHx, includes all composite harmonics from the DUT normally measured directly. The letter "x" in GHx represents a whole number, so if GHx is composed of second and third harmonics it will be a composite of GH2 and GH3. Harmonics from the source which are linearly passed by the DUT, GNx, are also readily measured with a VNA. In the method in accordance with the present invention, an output harmonic generated by the DUT, Hx, is calculated using vector subtraction according to the equation Hx=GHx−GNx. The output harmonic Hx will be free from source harmonic components and provide a more accurate measurement of parameters for the DUT.

When VNAs are used to measure harmonics in a conventional manner, a non-ratioed mode is used. But because of reliance of a VNA on ratioing to produce phase data, non-ratioed measurements can be noisy and inaccurate, and incapable of being used in a manner where the source harmonic contribution is characterized as a vector and mathematically removed. Accordingly, the method in accordance with the present invention provides for ratioing to obtain more accurate phase measurement results. To obtain the output harmonics Hx generated by the DUT relative to the source harmonic, the desired vector equation Hx=GHX−GNx can be used as described above. To obtain an output harmonic Hx' relative to the source fundamental, the general Hx measurements are multiplied by a relative source harmonic level, that is, a ratio of a scalar harmonic measurement SH determined from a through line to a scalar fundamental measurement SF from the through line, or SH/SF. To obtain an output harmonic Hx" relative to an output fundamental, the general Hx measurement is multiplied by the relative source harmonic level and then divided by the magnitude of a linear fundamental gain GN1 of the DUT as described in more detail to follow.

BRIEF DESCRIPTION OF THE DRAWINGS

The present invention will be described with respect to particular embodiments thereof, and references will be made to the drawings in which.

DETAILED DESCRIPTION

For the method in accordance with the present invention, the output harmonic Hx of the DUT is established relative to the source harmonic, the source fundamental, and the output fundamental. To do so, several general steps are performed using a VNA as outlined in the following paragraphs.

I. Establishing Modes For Calculations

With the source fundamental frequency range covering frequencies from f0 through f1, labeled here as [f0,f1], then the following shorthand can be established for modes used in subsequent calculations:

MODE {N1}: source [f0,f1], receiver [f0,f1]

MODE {N2}: source [2f0,2f1], receiver [2f0,2f1]

MODE {N3}: source [3f0,3f1], receiver [3f0,3f1]

MODE {H2}: source [f0,f1], receiver [2f0, 2f1]

MODE {H3}: source [f0,f1], receiver [3f0, 3f1]

The numbers 2 and 3 multiplied by the frequency ranges f0–f1 indicate that the second and third harmonics are used respectively. The measurements and calculations described below utilize the second and third harmonics, but other source harmonic levels may be used as long as the measurement ratios determined according to the present invention are not excessively noisy.

Figure 1:
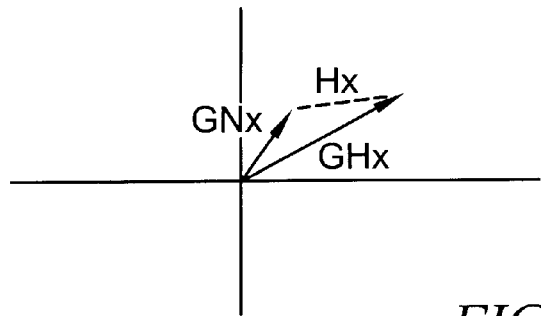
FIG. 1 is a vector diagram illustrating the relationship of the measured vector quantities GHx and GNx to the computed vector quantity Hx representing the harmonic response of a device obtained by the method according to the present invention.
Figure 2:
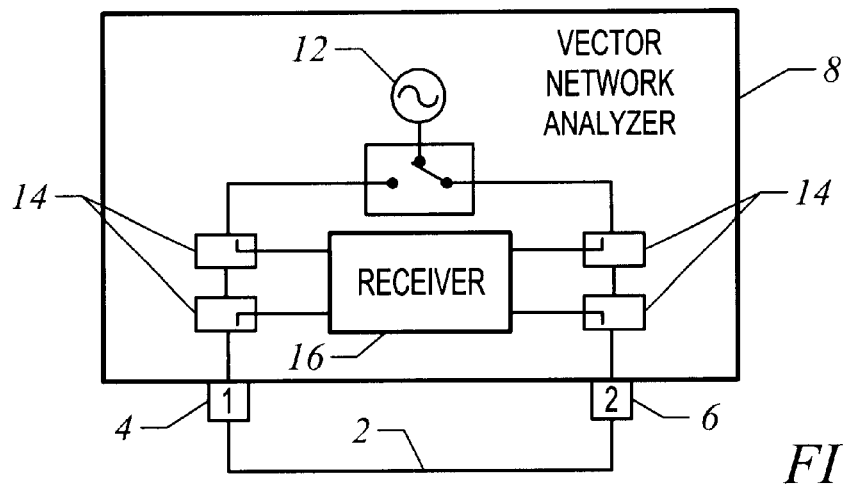
FIG. 2 is a simplified diagram illustrating a typical vector network analyzer with two terminals connected to a through line to establish normalization factors and a relative source harmonic level.
Figure 3:
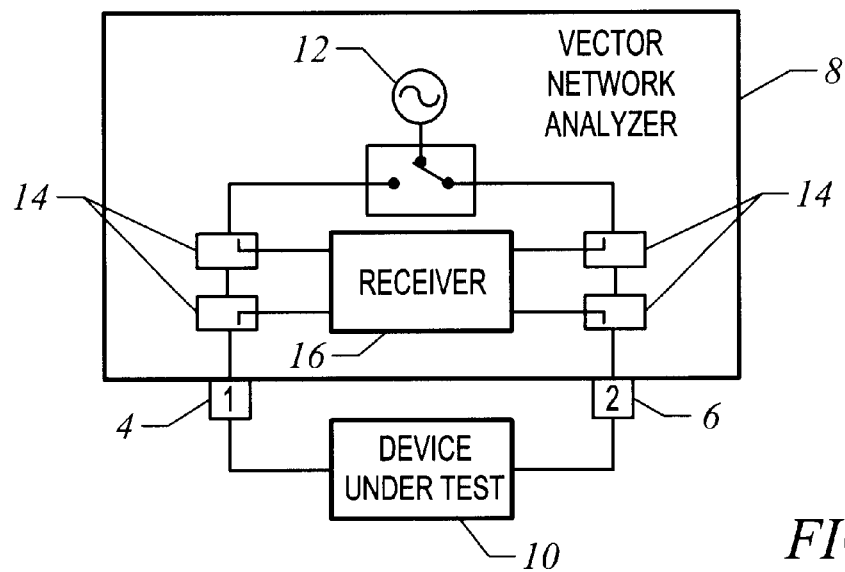
FIG. 3 is a simplified diagram illustrating a device under test connected to the terminals of the typical vector network analyzer to perform the process steps in the method for determining the harmonic response of the device according to the present invention.

To assure measurement accuracy in determining source harmonics, the source power level should be constant during measurements using the above modes. Because the source harmonics are a function of power In an embodiment in which the DUT to be measured is a two-port device, a test setup is established as shown in FIG. 2. In FIG. 2, a through line 2 is connected to the terminals 4 and 6 of a VNA 8 to establish a plurality of normalization factors and a relative source harmonic level before the DUT is connected to the VNA for subsequent measurements as shown in FIG. 3. As shown, the VNA includes a source 12 connectable through couplers 14 to terminals 4 and 6. A receiver 16 then receives signals from the DUT as well as source 12.

II. Connection of Through Line To Establish Normalizations and Relative Source Harmonic Levels In an embodiment in which the DUT to be measured is a two-port device, a test setup is established as shown in FIG. 2. In FIG. 2, a through line 2 is connected to the terminals 4 and 6 of a VNA 8 to establish a plurality of normalization factors and a relative source harmonic level before the DUT is connected to the VNA for subsequent measurements.

To establish the normalization factors, S21 measurements are first acquired from the through line with the system in modes N1, N2, N3, H2 and H3. The S21 values are stored as NS21N1, NS21N2, NS21N3, NS21H2 and NS21H3 respectively. These values will be used to normalize later DUT measurements. Note that the S21 measurements could be trivially replaced by S12 measurements if that is the requested parameter. For one-port S11 or S22 measurements, appropriate normalization is provided with a short.

The received signal, also referred to as the b2 signal, is measured in modes N1, H2 and H3. These b2 values are stored as b2(N1), b2(H2) and b2(H3) respectively.

To account for receiver power deviations from a flat level, an additional mode N0 is defined in which voltage measurements $b2(N0_A)$, $b2(N0_B)$ and $b2(N0_C)$ are made to normalize the b2(N1), b2(H2) and b2(H3) values. The N0 mode is established with the source 12 and receiver 14 operating over the same frequency range, such as f0-f1, as the mode being normalized, but with the source power level set at approximately 0 dBm. Note that it is possible that b2(N0) could be measured and stored as a global vector in the VNA at factory calibration time, since it is not likely to change over time on a scale that would cause errors in unratioed measurements.

Relative source harmonic levels Ox for the second and third harmonics are computed from the b2 values b2(N1), b2(H2) and b2(H3) as follows:

$$O2 = b2(H2)/b2(N1)$$

$$O3 = b2(H3)/b2(N1)$$

The relative source harmonic levels O2 and O3 are scalar quantities without phase information.

III. Connection Of DUT And Measurement In Normal Mode

After the normalization factors and the relative source harmonic levels are established, the through line is disconnected and the DUT 10 is connected to the terminals 4 and 6 of a VNA 8 as shown in FIG. 3. Once the DUT 10 is connected, S21 measurements are made in the normal modes N1, N2 and N3. The normalization values NS21N1, NS21N2 and NS21N3 are then applied respectively to obtain transfer coefficients GN1, GN2 and GN3. The GNx vector quantities GN1, GN2 and GN3 are the linear gains that the source fundamental, the second source harmonic and the third source harmonic will experience through the DUT, respectively.

In an embodiment in which the DUT is a nonlinear amplifier, it is desirable that the input source harmonic be at a sufficiently low power level such that the amplifier operates either within the linear region or close to the linear region at the harmonic frequency to obtain the transfer coefficients GN2 and GN3. For example, the power level for the source harmonic during the step of obtaining the transfer coefficient GN2 for the second harmonic may be set at approximately –4 dBc relative to the power level of a carrier signal at the fundamental frequency.

IV. Measurement of DUT In Harmonic Mode

While the DUT is connected to the VNA, S21 measurements are also made in the harmonic modes H2 and H3. The normalization values NS21H2 and NS21H3 are then applied respectively to obtain transfer coefficients GH2 and GH3. The GHx values GH2 and GH3 are the DUT output harmonics relative to the source fundamental.

V. Computation Of Corrections

With the measurements described above, the DUT output harmonic levels relative to the source harmonic component, the source fundamental frequency component, and the DUT output fundamental frequency component are calculated as follows:

A: Output Harmonic Hx Relative To Source Harmonic Component $$H2 = GH2 - GN2$$

$$H3 = GH3 - GN3$$

B: Output Harmonic Hx' Relative To Source Fundamental Frequency Component $$|H2'| = |GH2 - GN2|O2$$

$$|H3'| = |GH3 - GN3|O3$$

The computed values |H2'| and |H3'| are scalar quantities since phase information was not available for the Ox values O2 and O3. Alternatively, with only the magnitude of Ox available, the values Hx' could be calculated as vector quantities with the phase of Hx used for the phase of Hx'.

C: Output Harmonic Hx" Relative To Output Fundamental Frequency Component $$|H2''|=|GH2-GN2|O2|/GN1|$$

$$|H3''|=|GH3-GN3|O3|/GN1|$$

Again the computed values |H2"| and |H3"| are scalar quantities, but the values Hx" can be calculated as vector quantities with the phase of Hx/GNx used for the phase of Hx".

VI. Establishing Phase

Establishing the phase of harmonic components is particularly relevant for measurements of matching networks for power amplifier design. There is no direct method of establishing phase of the source fundamental relative to its harmonic. However, phase measurements can be made using a phase standard.

One phase standard which may be used in accordance with the present invention is a conventional shunt diode with sufficient RF power applied to it so that the diode starts clipping one side of the waveform. Based on a Fourier analysis, the second and third harmonic components from the DUT must be 180° out of phase relative to the source fundamental. The Fourier analysis is performed with a top-clipped cosine waveform with the reference phase being 0° for the source fundamental frequency component, which has a period T. The Fourier expansion is performed on a period centered at the origin and the clipping time is from $-x$ to $+x$. Because this waveform represents an even function, only the cosine terms are present in the Fourier expansion. The Fourier coefficients are thus expressed as:

$$a_n = \frac{4}{T}\int_0^x \cos\left(\frac{2\pi x}{T}\right)\cos\left(\frac{2\pi nt}{T}\right)dt +$$

$$\frac{4}{T}\int_x^{T/2}\cos\left(\frac{2\pi t}{T}\right)\cos\left(\frac{2\pi nt}{T}\right)dt$$

$$= \frac{2\cos\left(\frac{2\pi x}{T}\right)}{n\pi}\sin\left(\frac{2n\pi x}{T}\right) +$$

$$\frac{1}{\pi}\left[\frac{-1}{n+1}\sin\left(\frac{2(n+1)\pi x}{T}\right) + \frac{-1}{n-1}\sin\left(\frac{2(n-1)\pi x}{T}\right)\right],$$

For the first harmonic or fundamental, $$a_1 = \frac{2\cos\left(\frac{2\pi x}{T}\right)}{n}\sin\left(\frac{2\pi x}{T}\right) + \frac{1}{\pi}\left[\frac{1}{2}\left(-\sin\left(\frac{4\pi x}{T}\right)\right)\right] + 1 - \frac{2x}{T}$$

Since $0<x<T/4$, this term will be positive, and the phase reference for the fundamental is 0°.

For the second harmonic $$a_2 = \frac{\cos\left(\frac{2\pi x}{T}\right)}{\pi}\sin\left(\frac{4\pi x}{T}\right) + \frac{1}{\pi}\left[\frac{-1}{3}\sin\left(\frac{6\pi x}{T}\right) + \frac{-1}{1}\sin\left(\frac{2\pi x}{T}\right)\right]$$

Since $0<x<T/4$, it is easy to show that $a_2<=0$ and decreasing, and the phase shift is 180°.

For the third harmonic, $$a_3 = \frac{2\cos\left(\frac{2\pi x}{T}\right)}{3\pi}\sin\left(\frac{6\pi x}{T}\right) + \frac{1}{\pi}\left[\frac{-1}{4}\sin\left(\frac{8\pi x}{T}\right) + \frac{-1}{2}\sin\left(\frac{4\pi x}{T}\right)\right]$$

Since $0<x<T/4$, it is easy to show that $a_3<=0$, and the phase shift is 180°.

For the fourth harmonic, $$a_4 = \frac{\cos\left(\frac{2\pi x}{T}\right)}{2\pi}\sin\left(\frac{8\pi x}{T}\right) + \frac{1}{\pi}\left[\frac{-1}{5}\sin\left(\frac{10\pi x}{T}\right) + \frac{-1}{3}\sin\left(\frac{6\pi x}{T}\right)\right]$$

If $0<x/T \leq 0.17$, then $a4<=0$ and the phase shift is 180°. If $x/T \geq 0.17$ indicating more severe clipping of the cosine waveform, $a4>0$ and the phase shift is 0°. Therefore, the phase shift for the fourth harmonic relative to the phase of the fundamental frequency component depends upon the severity of clipping produced by the nonlinear DUT.

Measurements of Hx will acquire the phase angles $\phi x$ needed for calculating the phase components of Hx' and Hx". The phase angles measured for Hx are preferably referenced to a 0° reference plane established at the fundamental. With the standard being the shunt diode described above and the fundamental referenced to 0° at the standard, the correction angles 180°$-\phi 2$ and 180°$-\phi 3$ for the second and third harmonics can be applied to obtain the phases of the vector quantities Hx' and Hx". The use of an absolute phase reference plane eliminates the effect of any extra line length at the output of the DUT. The extra line length at the output of the DUT produces unreferenced output phases because of the different phase shifts experienced through the extra line length by the different harmonic signals.

To determine the harmonic phases in accordance with the present invention, a calibration standard, such as the shunt diode described above, is connected to the VNA With the standard connected, S21 measurements are made in modes H2 and H3. The normalization vector values NS21H2 and NS21H3 are then applied to the H2 and H3 measurements respectively to obtain corrected transfer coefficients termed GH2C and GH3C. S21 measurements are further made with the standard connected in mode {N1} to obtain the transfer coefficient GN1. Next phase offsets POx are calculated as follows:

$$\angle PO2=\angle \text{ref2}-\angle GH2C+\angle GN1$$

$$\angle PO3=\angle \text{ref3}-\angle GH3C+\angle GN1$$

wherein $\angle PO2$ and $\angle PO3$ are the harmonic phase responses of the DUT at the second and third harmonics respectively, $\angle \text{ref2}$ and $\angle \text{ref3}$ are 180° as calculated using Fourier series analysis for the shunt diode, $\angle GH2C$ and $\angle GH3C$ are the phases of the corrected harmonic transfer coefficients GH2C and GH3C after normalization, and $\angle GN1$ is the phase of the transfer coefficient GN1 at the fundamental frequency.

After the harmonic phase responses $\angle PO2$ and $\angle PO3$ are obtained, the vector harmonic responses H2' and H3' of the DUT at the second and third harmonics to the input fundamental frequency component are obtained respectively according to the following relationships:

$$H2'=(GH2-GN2)(1\angle PO2)O2$$

$$H3'=(GH3-GN3)(1\angle PO3)O3$$

In a similar manner, the vector harmonic outputs H2" and H3" of the DUT at the second and third harmonics relative to the output fundamental frequency component are obtained respectively according to the following relationships:

$$H2"=(GH2-GN2)(1\angle PO2)O2/GN1$$

$$H3"=(GH3-GN3)(1\angle PO3)O3/GN1$$

The harmonic responses of the DUT to the input fundamental frequency component as well as the harmonic outputs of the DUT relative to the output fundamental frequency component are thus obtained as vector quantities with magnitude and phase information.

The present invention has been described with respect to particular embodiments thereof, and numerous modifications can be made which are within the scope of the invention as set forth in the claims.

What is claimed is:

1. A method for removing a source signal harmonic from a measurement of a harmonic response of a device under test (DUT) at a harmonic frequency by using a vector network analyzer (VNA) containing a signal source generating the source harmonic, the method comprising the steps of:

determining a first vector response GNx of the DUT to a first source signal at the harmonic frequency;

determining a second vector response GHx of the DUT to a second source signal which comprises a source signal fundamental frequency component and the source signal harmonic component at the harmonic frequency, the second vector response GHx having an output fundamental frequency component and an output harmonic frequency component;

subtracting the first vector response GNx from the second vector response Ghx to obtain a vector Hx representing the harmonic response of the DUT relative to the source signal fundamental frequency component with the source signal harmonic frequency component removed; and using the vector Hx to determine a transfer vector |Hx"| representing a magnitude of the harmonic response of the DUT relative to the output fundamental frequency component.

2. The method of claim 1, further comprising the steps of:

connecting a through line between first and second terminals of the VNA;

measuring a first normalization factor NS21Nx when the through line is connected between the first and second terminals of the VNA, the first normalization factor NS21Nx comprising a vector ratio of a scattered voltage at the harmonic frequency to an incident voltage at the harmonic frequency; and measuring a second normalization factor NS21Hx when the through line is connected between the first and second terminals of the VNA, the second normalization factor NS21Hx comprising a vector ratio of a scattered voltage at the harmonic frequency to an incident voltage at the harmonic frequency with the second source signal tuned to the fundamental frequency.

3. The method of claim 2, wherein the step of determining the first vector response GNx comprises the steps of:

connecting the DUT between the first and second terminals of the VNA;

measuring a first scattering parameter when the DUT is connected between the first and second terminals of the VNA, the first scattering parameter comprising a vector ratio of a scattered voltage at the harmonic frequency to an incident voltage at the harmonic frequency, with the first source signal tuned to the harmonic frequency; and applying the first normalization factor NS21Nx to the first scattering parameter to obtain the first vector response GNx.

4. The method of claim 3, wherein the step of determining the second vector response GHx comprises the steps of:

measuring a second scattering parameter when the DUT is connected between the first and second terminals of the VNA, the second scattering parameter comprising a vector ratio of a scattered voltage at the harmonic frequency to an incident voltage at the harmonic frequency, with the second source signal tuned to the fundamental frequency; and applying the second normalization factor NS21Hx to the second scattering parameter to obtain the second vector response GHx.

5. The method of claim 4, further comprising the steps of establishing a relative source harmonic level Ox by determining a scalar ratio of the magnitude of the scattered voltage at the harmonic frequency to the magnitude of the scattered voltage at the fundamental frequency when the through line is connected between the first and second terminals of the VNA.

6. The method of claim 5 further comprising the step of:

multiplying the magnitude of the vector Hx by the relative source signal harmonic level Ox to obtain a scalar transfer response |Hx'|.

7. The method of claim 6 further comprising the steps of:

measuring a third normalization factor NS21N1 when the through line is connected between the first and second terminals of the VNA, the third normalization factor NS21N1 comprising a vector ratio of a scattered voltage at the fundamental frequency to the incident voltage at the fundamental frequency;

measuring a third scattering parameter when the DUT is connected between the first and second terminals of the VNA, the third scattering parameter comprising a vector ratio of a scattered voltage at the fundamental frequency to an incident voltage at the fundamental frequency;

applying the first normalization factor NS21N1 to the first scattering parameter to obtain a vector transfer coefficient GN1; and dividing the scalar transfer response |Hx'| by the magnitude of the vector transfer coefficient GN1 to obtain |Hx"|.

8. The method of claim 1, wherein the letter x in GHx, GNx and |Hx"| indicates a harmonic number for the harmonic frequency at which the harmonic output is determined, the method further comprising the steps of:

defining a mode {N2} wherein S21 measurements are made with the source tuned to a second harmonic and a receiver receiving an output component from a device connected between terminals of the VNA, the receiver being tuned to the second harmonic;

defining a mode {N3} wherein S21 measurements are made with the source tuned to a third harmonic and the receiver tuned to the third harmonic;

defining a mode {H2} wherein S21 measurements are made with the source tuned to the fundamental and the receiver tuned to the second harmonic;

defining a mode {H3} wherein S21 measurements are made with the source tuned to the fundamental and the receiver tuned to the third harmonic;

connecting a through line between first and second terminals of the VNA;

measuring the through line in the mode {N2} to establish a normalization factor NS21N2;

measuring the through line in the mode {N3} to establish a normalization factor NS21N3;

measuring the through line in the mode {H2} to establish a normalization factor NS21H2;

measuring the through line in the mode {H3} to establish a normalization factor NS21H3;

connecting a DUT between the first and second terminals of the VNA;

measuring the DUT in the mode {N2} and applying the normalization factor NS21N2 to obtain the first vector transfer coefficient for the second harmonic GN2;

measuring the DUT in the mode {N3} and applying the normalization factor NS21N3 to obtain the first vector transfer coefficient for the third harmonic GN3;

measuring the DUT in the mode {H2} and applying the normalization factor NS21H2 to obtain the second vector transfer coefficient for the second harmonic GH2;

measuring the DUT in the mode {H3} and applying the normalization factor NS21H3 to obtain the second vector transfer coefficient for the third harmonic GH3;

calculating the vector quantity GH2−GN2 to obtain a transfer vector for the second harmonic H2; and calculating the vector quantity GH3−GN3 to obtain a transfer vector for the third harmonic H3.

9. The method of claim 8 wherein $|H2'|$ and $|H3'|$ representing magnitudes of the harmonic outputs of the DUT relative to the source signal fundamental frequency component for the second and third harmonics respectively are calculated, the method further comprising the steps of:

defining a mode {N1} wherein S21 measurements are made with the source tuned to the fundamental and the receiver tuned to the fundamental;

measuring voltage from the receiver in mode {N1} with the through line connected to obtain a value b2(N1);

measuring voltage from the receiver in mode {H2} with the through line connected to obtain a value b2(H2);

measuring voltage from the receiver in mode {H3} with the through line connected to obtain a value b2(H3);

calculating b2(H2)/b2(N1) to obtain a value O2;

calculating b2(H3)/b2(N1) to obtain a value O3;

calculating $|H2|O2$ to obtain $|H2'|$; and calculating $|H3|O3$ to obtain $|H3'|$.

10. The method of claim 9, $|H2''|$ and $|H3''|$ representing magnitudes of the harmonic outputs of the DUT relative to the output fundamental frequency component for the second and third harmonics respectively are calculated, the method further comprising the steps of:

measuring the through line in the mode {N1} to establish a normalization factor NS21N1;

measuring the DUT in the mode {N1} and applying the normalization factor NS21N1 to obtain a fundamental vector transfer coefficient GN1;

calculating $|H2'|/GN1$ to obtain $|H2''|$; and calculating $|H3'|/GN1$ to obtain $|H3''|$.

11. The method of claim 9, further comprising the steps of:

measuring voltage from the receiver with the through line connected, with the source tuned to the fundamental, the receiver tuned to the fundamental, and power of the source set to approximately 0 dBm to obtain a value $b2(NO_A)$;

measuring voltage from the receiver with the through line connected, with the source tuned to the fundamental, the receiver tuned to the second harmonic, and power of the source set to approximately 0 dBm to obtain a value $b2(NO_B)$;

measuring voltage from the receiver with the through line connected, with the source tuned to the fundamental, the receiver tuned to the third harmonic, and power of the source set to approximately 0 dBm to obtain a value $b2(NO_C)$;

normalizing the value b2(N1) with the value $b2(NO_A)$ prior to calculating the values O2 and O3;

normalizing the value b2(H2) with the value $b2(NO_B)$ prior to calculating the value O2; and normalizing the value b2(H3) with the value $b2(NO_C)$ prior to calculating the values O3.

* * * * *

UNITED STATES PATENT AND TRADEMARK OFFICE
CERTIFICATE OF CORRECTION

PATENT NO. : 6,396,287 B1
DATED : May 28, 2002
INVENTOR(S) : Peter Kapetanic et al.

It is certified that error appears in the above-identified patent and that said Letters Patent is hereby corrected as shown below:

Column 1,
Line 16, after "more" and before "particularly" delete "5".

Column 3,
Line 34, after "power" insert -- level at least to some degree, changes in the source power can make calculations inaccurate. If the source is to be operated at different power levels, the corrections determined below must be repeated for each desired power level since source harmonics may vary between different power levels. --
Line 67, after "mode" and before "is" delete "NO" and substitute therefor -- N0 --.

Column 4,
Line 41, after "approximately" and before "relative" delete "4 dBc" and substitute therefor -- 40dBc --.

Column 6,
Line 16, after "If" and before "0.17," delete "≦" and substitute therefor -- ≲ --.
Line 17, after "x/T" and before "0.17" delete "≧" and substitute therefor -- ≳ --.

Column 7,
Line 5, after "(GH2" and before "GN2)" delete "=" and substitute therefor -- - --.
Line 6, after "(GH3" and before "GN3)" delete "=" and substitute therefor -- - --.

Column 8,
Line 19, after "source" and before "harmonic" insert -- signal --.

Signed and Sealed this

Tenth Day of February, 2004

JON W. DUDAS
*Acting Director of the United States Patent and Trademark Office*